United States Patent
Sim et al.

(10) Patent No.: US 11,597,848 B2
(45) Date of Patent: Mar. 7, 2023

(54) INK COMPOSITION, LIGHT-EMITTING DEVICE INCLUDING THE SAME, AND METHOD OF PREPARING THE LIGHT-EMITTING DEVICE

(71) Applicant: Samsung Display Co., Ltd., Yongin-si (KR)

(72) Inventors: Junbo Sim, Yongin-si (KR); Dukki Kim, Yongin-si (KR); Hyojin Ko, Yongin-si (KR); Changhee Lee, Yongin-si (KR); Jaekook Ha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 297 days.

(21) Appl. No.: 17/092,918

(22) Filed: Nov. 9, 2020

(65) Prior Publication Data
US 2021/0269662 A1 Sep. 2, 2021

(30) Foreign Application Priority Data

Feb. 26, 2020 (KR) .................. 10-2020-0023456

(51) Int. Cl.
*H01L 51/00* (2006.01)
*C09D 11/36* (2014.01)
(Continued)

(52) U.S. Cl.
CPC ............ *C09D 11/36* (2013.01); *C09D 11/033* (2013.01); *C09D 11/50* (2013.01);
(Continued)

(58) Field of Classification Search
CPC .................................................. C09D 11/36
See application file for complete search history.

(56) References Cited

U.S. PATENT DOCUMENTS 7,867,413 B2 1/2011 Lee et al.
10,449,133 B1 10/2019 Faig et al.
(Continued)

FOREIGN PATENT DOCUMENTS

CN 109181414 1/2019
KR 10-2007-0002934 1/2007
(Continued)

*Primary Examiner* — Caleb E Henry
(74) *Attorney, Agent, or Firm* — Kile Park Reed & Houtteman PLLC

(57) ABSTRACT

An inkjet composition for an inkjet printer, a light-emitting device including the same, and a method of manufacturing the light-emitting device are provided. The ink composition may include light-emitting diodes and a solvent. The solvent may have a first viscosity at a first temperature section that may be greater than a second viscosity at a second temperature section. The solvent may include an ester compound of citric acid, glycol, alkanediol, alkanolamine, alkenic acid, alkenol, a pyrrolidone group-containing compound, glycerol, a compound represented by Formula 1, a compound represented by Formula 2, or any combination thereof:

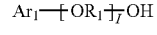

<Formula 1>

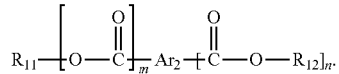

<Formula 2>

Substituents in Formula 1 and Formula 2 may be understood as described in connection with the detailed description. Each of the light-emitting diodes may have a size in a range of about 0.1 μm to about 10 μm.

20 Claims, 3 Drawing Sheets

(51) Int. Cl.
  *C09D 11/033* (2014.01)
  *C09D 11/50* (2014.01)
  *H01L 51/56* (2006.01)
(52) U.S. Cl.
  CPC ...... *H01L 51/0005* (2013.01); *H01L 51/0007* (2013.01); *H01L 51/0012* (2013.01); *H01L 51/56* (2013.01)

(56) References Cited

U.S. PATENT DOCUMENTS

| | | | | |
|---|---|---|---|---|
| 2001/0003602 | A1* | 6/2001 | Fujita | H01L 51/0038 427/64 |
| 2005/0211998 | A1* | 9/2005 | Daniels | H01L 27/14625 257/89 |
| 2005/0212007 | A1* | 9/2005 | Daniels | F21K 9/00 257/688 |
| 2005/0212406 | A1* | 9/2005 | Daniels | F21K 9/90 313/503 |
| 2005/0214962 | A1* | 9/2005 | Daniels | H01L 27/14625 438/22 |
| 2005/0214963 | A1* | 9/2005 | Daniels | H01L 31/1876 257/E25.02 |
| 2007/0001608 | A1 | 1/2007 | Lee et al. | |
| 2007/0090387 | A1* | 4/2007 | Daniels | H01L 24/75 257/E33.059 |
| 2007/0105250 | A1* | 5/2007 | Daniels | H01L 25/50 257/E33.059 |
| 2014/0145237 | A1* | 5/2014 | Do | H01L 33/44 438/34 |
| 2018/0346741 | A1 | 12/2018 | Pan et al. | |

FOREIGN PATENT DOCUMENTS

| | | |
|---|---|---|
| KR | 10-1082146 | 11/2011 |
| KR | 10-2018-0084087 | 7/2018 |

* cited by examiner

INK COMPOSITION, LIGHT-EMITTING DEVICE INCLUDING THE SAME, AND METHOD OF PREPARING THE LIGHT-EMITTING DEVICE

CROSS-REFERENCE TO RELATED APPLICATION(S)

This application claims priority to and benefit of Korean Patent Application No. 10-2020-0023456 under 35 U.S.C. § 119, filed on Feb. 26, 2020 in the Korean Intellectual Property Office, the entire contents of which are incorporated herein by reference.

BACKGROUND

1. Technical Field

Embodiments relate to an ink composition, a light-emitting device including the same, and a method of preparing the light-emitting device.

2. Description of the Related Art

A light-emitting diode (LED) has high light conversion efficiency and very low energy consumption, and is semipermanent and environmentally friendly. In order to utilize an LED in lighting or a display device, it is necessary to connect the LED between a pair of electrodes capable of applying power to the LED. Methods of connecting the LED and the electrodes may be classified into a method of directly growing LEDs on a pair of electrodes and a method of aligning LEDs after the LEDs are separately grown and then introduced into the electrodes. In the latter method, a solution process may be utilized as a way of introducing the LEDs into the electrodes. For example, the LEDs may be introduced into the electrodes by using a slit coating method or an inkjet printing.

Regarding an ink composition used in such a solution process, the ink composition may be stably spreadable and ejected, functional materials (e.g., LEDs) and solvents in the ink composition do not undergo phase separation, and when forming a film, the ink composition may be able to form a uniform film. In particular, dispersion stability of LED-containing ink is important in terms of uniformly introducing the LEDs on the electrodes. In the case of using ink in which phase separation occurs, clogging of a printer head may be caused during an inkjet printing process, thereby degrading the processability of the inkjet printing.

SUMMARY

Embodiments include an ink composition, a light-emitting device including the same, and a method of preparing the light-emitting device, wherein, when the ink composition is stored at room temperature, phase separation is minimized, and the ink composition does not agglomerate during an inkjet printing process.

Additional aspects will be set forth in part in the description which follows and, in part, will be apparent from the description, or may be learned by practice of the embodiments of the disclosure.

According to embodiments, an ink composition may include light-emitting diodes and a solvent, wherein the solvent may have a first viscosity at a first temperature section that may be greater than a second viscosity at a second temperature section. Each of the light-emitting diodes may have a size in a range of about 0.1 µm to about 10 µm.

The first temperature section may include a temperature at which the ink is stored.

The inkjet printer may include an ejection portion, and the second temperature section may include a temperature of the ejection portion.

The first viscosity may be in a range of about 15 cP to about 100 cP.

The second viscosity may be in a range of about 5 cP to about 14 cP.

The solvent may include an ester compound of citric acid, glycol, alkanediol, alkanolamine, alkenic acid, alkenol, a pyrrolidone group-containing compound, glycerol, a compound represented by Formula 1, a compound represented by Formula 2, or any combination thereof:

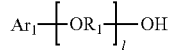
<Formula 1>

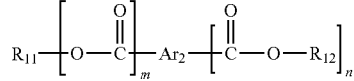
<Formula 2> wherein in Formulae 1 and 2, $Ar_1$ may be a substituted or unsubstituted $C_6$-$C_{60}$ aryl group, $Ar_2$ may be selected from a substituted or unsubstituted $C_6$-$C_{60}$ arylene group and a substituted or unsubstituted $C_1$-$C_{20}$ alkylene group, $R_1$ may be selected from a substituted or unsubstituted $C_1$-$C_{20}$ alkylene group and a substituted or unsubstituted $C_2$-$C_{20}$ alkenylene group, $R_{11}$ and $R_{12}$ may each independently be selected from a substituted or unsubstituted $C_1$-$C_{20}$ alkyl group, a substituted or unsubstituted $C_2$-$C_{20}$ alkenyl group, and a substituted or unsubstituted $C_6$-$C_{60}$ aryl group, l may be an integer from 1 to 5, n may be 0 or 1, and m may be an integer from 1 to 3.

Each of the light-emitting diodes may include a first semiconductor layer, a second semiconductor layer, and an active layer disposed between the first semiconductor layer and the second semiconductor layer.

Each of the light-emitting diodes may further include a first electrode layer disposed under the first semiconductor layer, and a second electrode layer disposed over the second semiconductor layer.

The light-emitting diodes may have a cylinder shape.

The light-emitting diodes may have a diameter in a range of about 0.1 µm to about 1 µm, and a length in a range of about 0.1 µm to about 10 µm.

The light-emitting diodes may have a concentration in a range of about 0.01 weight % to about 1 weight % based on the total ink composition.

According to embodiments, a method of manufacturing a light-emitting apparatus includes providing a substrate including an emission region in which a first electrode and a second electrode are spaced apart from each other, providing the ink composition on the emission region to dispose the light-emitting diodes in the emission region, and aligning the light-emitting diodes at a region between the first electrode and the second.

The providing of the ink composition on the emission region may be performed by an inkjet printer.

The inkjet printer may include an ejection portion, and the viscosity of the ink composition in the ejection portion may be in a range of about 5 cP to about 14 cP.

The inkjet printer may include an ejection portion, and the ejection portion may have a temperature in a range of about 35° C. to about 70° C.

The aligning of the light-emitting diodes may include applying an electric field formed between the first electrode and the second electrode.

According to embodiments, a light-emitting device includes
a first electrode,
a second electrode facing the first electrode, and
a layer disposed between the first electrode and the second electrode, wherein the layer includes an emission layer,
and the layer is formed by using the ink composition.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
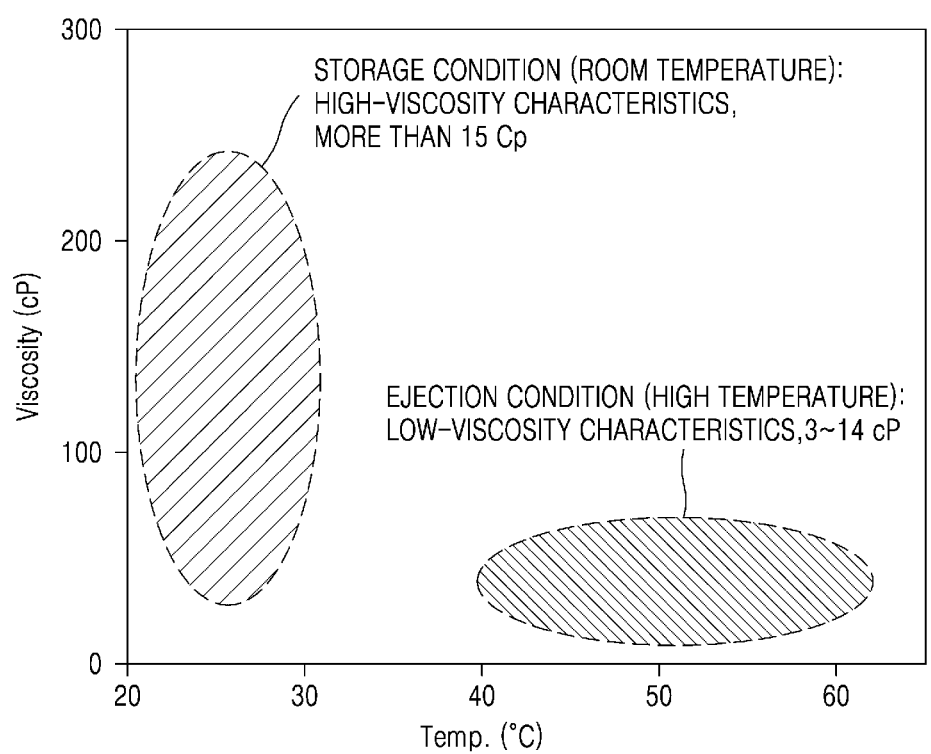
FIG. 1 is a graph showing characteristics of a solvent according to an embodiment in which viscosity decreases with increasing temperatures.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, or C" may indicate only A, only B, only C, both A and B, both A and C, both B and C, all of A, B, and C, or variations thereof.

The term "at least one of" is intended to include the meaning of "at least one selected from the group consisting of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

As the disclosure can apply various transformations and can have various examples, specific examples will be illustrated in the drawings and described in detail in the detailed description. Effects and features of the disclosure, and methods of achieving the same will be clarified by referring to Examples described in detail later with reference to the drawings. However, the disclosure is not limited to the examples disclosed below and may be implemented in various forms.

Hereinafter, embodiments will be described in detail with reference to the accompanying drawings. The same or corresponding components will be denoted by the same reference numerals, and thus redundant description thereof will be omitted.

As used herein, the singular forms "a," "an," and "the" are intended to include the plural forms as well, unless the context clearly indicates otherwise.

It will be further understood that the terms "comprises," "comprising," "includes," "including," "contains," and/or "containing" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Sizes of elements in the drawings may be exaggerated for convenience of explanation. In other words, since sizes and thicknesses of components in the drawings are arbitrarily illustrated for convenience of explanation, the embodiments are not limited thereto.

In the specification, the term "room temperature" refers to about 23° C.

[Ink Composition]

An ink composition for an inkjet printer according to an embodiment may include subminiature light-emitting diodes and a solvent, wherein the solvent has a first viscosity at a first temperature section that may be greater than a second viscosity at a second temperature section.

In an embodiment, the first temperature section may include a temperature for storing the ink composition for the inkjet printer. For example, the first temperature section may be in a range of about 20° C. to about 30° C.

In an embodiment, the second temperature section may include a temperature of an ejection portion of the inkjet printer. For example, the second temperature section may be in a range of about 35° C. to about 70° C.

In an embodiment, the first viscosity of the solvent at the first temperature section may be in a range of about 15 cP to about 100 cP.

In an embodiment, the second viscosity of the solvent at the second temperature section may be in a range of about 5 cP to about 14 cP.

In order to quantitatively position a subminiature light-emitting diode (e.g., a nano LED or a micro LED), which is applicable in a light-emitting device, on a substrate, ink formation (as a dispersion) and ink coating of particles of the subminiature light-emitting diode are required.

In the case of an ink composition in which particles of the subminiature light-emitting diode are dispersed, problems may occur depending on the characteristics of the particles (e.g., size, specific gravity, etc.).

For example, modification of the particle surface or addition of a dispersant may be necessary to dissolve the ink in a suitable solvent for coating. Furthermore, even after dispersion is properly performed, sedimentation of the particles by gravity may occur when the particles are in a large size and have great specific gravity.

When the particle sedimentation occurs, uneven coating (printing) may occur due to a concentration gradient of the particles in the ink. The processability may be degraded due to agglomeration of the particles in a coater region, a printer head region, or a piping region.

The solvent of the ink composition according to an embodiment may have high viscosity at room temperature, which is a temperature for storage, and thus, even when the ink composition is stored for a long time, layer separation hardly occurs in the ink composition.

The solvent of the ink composition according to an embodiment has lowered viscosity at a relatively high temperature, so that the viscosity may be lowered by adjusting the temperature of the ejection portion. Accordingly, the printing process may proceed without difficulty.

FIG. 1 is a graph showing characteristics of the solvent according to an embodiment in which the viscosity decreases with increasing temperature.

Considering that the subminiature light-emitting diode in the ink composition according to an embodiment has a low concentration, there is little substantial difference between the viscosity of the solvent and the viscosity of the ink composition.

Referring to FIG. 1, the ink composition according to an embodiment maintains high viscosity during storage, and may have lowered the viscosity by adjusting the temperature at the time of ejection. Thus, modification of the particle surface of the subminiature light-emitting diode or particular addition of a dispersant is not required.

When the ink composition according to an embodiment is stored while maintaining the room temperature conditions (for example, 23° C.), due to the high viscosity, a dispersion stability time of 12 hours or more may be obtained.

When the ink composition according to an embodiment is used for the inkjet printing process, the temperature of the coater region or the printer head region may be raised to, for example, 40° C. to 60° C., thereby obtaining high inkjet printing processability due to appropriately lowered viscosity at the respective temperatures.

[Solvent]

In an embodiment, the solvent may include an ester compound of citric acid, glycol, alkanediol, alkanolamine, alkenic acid, alkenol, a pyrrolidone group-containing compound, glycerol, a compound represented by Formula 1, a compound represented by Formula 2, or any combination thereof:

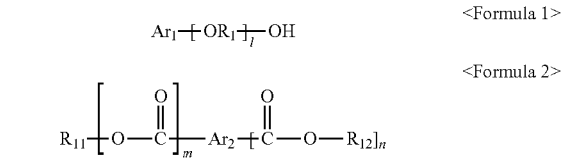

In Formulae 1 and 2, $Ar_1$ may be a substituted or unsubstituted $C_6$-$C_{60}$ aryl group, $Ar_2$ may be selected from a substituted or unsubstituted $C_6$-$C_{60}$ arylene group and a substituted or unsubstituted $C_1$-$C_{20}$ alkylene group, $R_1$ may be selected from a substituted or unsubstituted $C_1$-$C_{20}$ alkylene group and a substituted or unsubstituted $C_2$-$C_{20}$ alkenylene group, $R_{11}$ and $R_{12}$ may each independently be selected from a substituted or unsubstituted $C_1$-$C_{20}$ alkyl group, a substituted or unsubstituted $C_2$-$C_{20}$ alkenyl group, and a substituted or unsubstituted $C_6$-$C_{60}$ aryl group, l may be an integer from 1 to 5, n may be 0 or 1, and m may be an integer from 1 to 3.

The $C_1$-$C_{20}$ alkyl group, the $C_1$-$C_{20}$ alkylene group, the $C_2$-$C_{20}$ alkenyl group, and the $C_2$-$C_{20}$ alkenylene group may each independently be linear or branched.

The ester compound of citric acid refers to a compound produced by an ester reaction between citric acid and alcohol.

The reaction between citric acid and alcohol is as follows (stereochemical labeling is omitted):

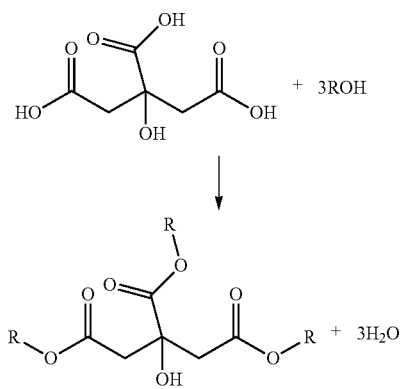

The alcohol (ROH) may be $C_1$-$C_{20}$ alkanol or $C_2$-$C_{20}$ alkenol.

The term "$C_1$-$C_{20}$ alkanol" as used herein refers to a compound in which an OH group is present in a $C_1$-$C_{20}$ alkyl group.

The term "$C_2$-$C_{20}$ alkenol" as used herein refers to a compound in which an OH group is present in a $C_2$-$C_{20}$ alkene group.

The $C_1$-$C_{20}$ alkyl group and the $C_2$-$C_{20}$ alkene group may each independently be linear or branched.

In the reaction above, each ROH of 3ROH may be identical to or different from each other. For example, three Rs in the ester compound of citric acid may be identical to or different from each other.

For example, a compound produced by an ester reaction between ethanol ($C_2H_5OH$) and citric acid may be triethyl citrate.

The term "glycol" as used herein refers to a compound including two OH groups, a $C_1$-$C_{20}$ alkylene group, and a heteroatom (for example, O, S, etc.). The $C_1$-$C_{20}$ alkylene group may be linear or branched.

Non-limiting examples of glycol are diethylene glycol, dipropylene glycol, thiodiethylene glycol, triethylene glycol, and the like.

The term "alkandiol" as used herein refers to a compound in which two OH groups are present in a $C_1$-$C_{20}$ alkyl group. The $C_1$-$C_{20}$ alkyl group may be linear or branched.

Non-limiting examples of the alkanediol are 1,3-butanediol, 1,3-propanediol, 1,9-nonanediol, hexane 1,6 diol, 2-ethyl-1,3-hexanediol, and the like.

The term "alkanolamine" as used herein refers to a compound in which an N group and an OH group are present in a $C_1$-$C_{20}$ alkyl group. The $C_1$-$C_{20}$ alkyl group may be linear or branched.

Non-limiting examples of alkanolamine are triethanolamine and the like.

The term "$C_2$-$C_{20}$ alkenic acid" as used herein refers to a compound in which a COOH group is present in a $C_2$-$C_{20}$ alkene group. The $C_2$-$C_{20}$ alkene group may be linear or branched.

Non-limiting examples of alkenic acid are oleic acid and the like.

The term "alkenol" as used herein refers to a compound in which an OH group is present in a $C_2$-$C_{20}$ alkene group. The $C_2$-$C_{20}$ alkene group may be linear or branched.

Non-limiting examples of alkenol are oleyl alcohol and the like.

The term "pyrrolidone group-containing compound" as used herein refers to a compound including a pyrrolidone group and 1 to 20 carbon atoms. The pyrrolidone group-containing compound may include, in addition to N and O that are present in a pyrrolidone group, a heteroatom (e.g., N, O, S, etc.).

Non-limiting examples of the pyrrolidone group-containing compound are N-(2-hydroxyethyl)-2-pyrrolidone, N-cyclohexyl-2-pyrrolidone, N-benzyl pyrrolidone, and the like.

In the solvent of the ink composition for the inkjet printer according to an embodiment, the first viscosity at the first temperature section may be greater than the second viscosity at the second temperature section.

For use as the solvent, an ester compound of citric acid, glycol, alkanediol, alkanolamine, alkenic acid, alkenol, a pyrrolidone group-containing compound, glycerol, a compound represented by Formula 1, and a compound represented by Formula 2 may be used alone.

When use of a single solvent is not enough to obtain viscosity for appropriate storage/inkjet process at the same time, two or more solvents may be appropriately mixed to obtain the required viscosity.

In an embodiment, the solvent may be a mixture of two or more of the solvents described above.

For example, the solvent may be: a mixture of an ester compound of citric acid and glycol; a mixture of an ester compound of citric acid and alkanediol; a mixture of an ester compound of citric acid and alkanolamine; a mixture of an ester compound of citric acid and alkenic acid; a mixture of an ester compound of citric acid and alkenol; a mixture of an ester compound of citric acid and a pyrrolidone group-containing compound; a mixture of an ester compound of citric acid and glycerol; a mixture of an ester compound of citric acid and a compound of Formula 1; and a mixture of an ester compound of citric acid and a compound of Formula 2.

For example, the solvent may be: a mixture of glycol and alkanediol; a mixture of glycol and alkanolamine; a mixture of glycol and alkenic acid; a mixture of glycol and alkenol; a mixture of glycol and a pyrrolidone group-containing compound; a mixture of glycol and glycerol; a mixture of glycol and a compound of Formula 1; and a mixture of glycol and a compound of Formula 2.

For example, the solvent may be: a mixture of alkanediol and alkanolamine; a mixture of alkanediol and alkenic acid; a mixture of alkanediol and alkenol; a mixture of alkanediol and a pyrrolidone group-containing compound; a mixture of alkanediol and glycerol; a mixture of alkanediol and a compound of Formula 1; and a mixture of alkanediol and a compound of Formula 2.

For example, the solvent may be: a mixture of alkanolamine and alkenic acid; a mixture of alkanolamine and alkenol; a mixture of alkanolamine and a pyrrolidone group-containing compound; a mixture of alkanolamine and glycerol; a mixture of alkanolamine and a compound of Formula 1; and a mixture of alkanolamine and a compound of Formula 2.

For example, the solvent may be: a mixture of alkenic acid and alkenol; a mixture of alkenic acid and a pyrrolidone group-containing compound; a mixture of alkenic acid and glycerol; a mixture of alkenic acid and a compound of Formula 1; and a mixture of alkenic acid and a compound of Formula 2.

For example, the solvent may be: a mixture of alkenol and a pyrrolidone group-containing compound; a mixture of alkenol and glycerol; a mixture of alkenol and a compound of Formula 1; and a mixture of alkenol and a compound of Formula 2.

For example, the solvent may be: a mixture of a pyrrolidone group-containing compound and glycerol; a mixture of a pyrrolidone group-containing compound and a compound of Formula 1; and a mixture of a pyrrolidone group-containing compound and a compound of Formula 2.

For example, the solvent may be: a mixture of glycerol and a compound of Formula 1; and a mixture of glycerol and a compound of Formula 2.

For example, the solvent may be a mixture of a compound of Formula 1 and a compound of Formula 2.

For example, the solvent may be: a mixture of an ester compound of citric acid, glycol, and alkanediol; a mixture of an ester compound of citric acid, glycol, and alkanolamine; a mixture of an ester compound of citric acid, glycol, and alkenic acid; a mixture of an ester compound of citric acid, glycol, and alkenol; a mixture of an ester compound of citric acid, glycol, and a pyrrolidone group-containing compound; a mixture of an ester compound of citric acid, glycol, and glycerol; a mixture of an ester compound of citric acid, glycol, and a compound of Formula 1; and a mixture of an ester compound of citric acid, glycol, and a compound of Formula 2.

In an embodiment, Formula 1 may be represented by Formula 3 below:

<Formula 3>

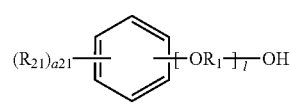

In Formula 3, $R_{21}$ may be selected from hydrogen, deuterium, a hydroxyl group, and a substituted or unsubstituted $C_1$-$C_{20}$ alkyl group, a21 may be an integer from 1 to 5, and $R_1$ and l are the same as defined in Formula 1.

In an embodiment, Formula 2 may be represented by Formula 4 below:

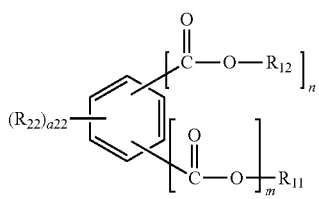

<Formula 4>

In Formula 4, $R_{22}$ may be selected from hydrogen, deuterium, a hydroxyl group, and a substituted or unsubstituted $C_1$-$C_{20}$ alkyl group, a22 may be an integer from 1 to 4, and $R_{11}$, $R_{12}$, m, and n are the same as defined in Formula 2.

In an embodiment, Formula 4 may be represented by Formula 5 below:

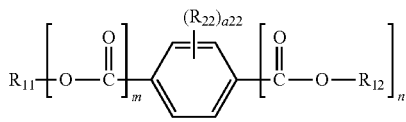

<Formula 5>

In Formula 5, substituents and symbols are the same defined in Formula 4.

In an embodiment, Formula 4 may be represented by Formula 6 below:

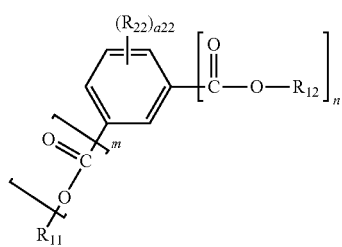

<Formula 6>

In Formula 6, substituents and symbols are the same defined in Formula 4.

In an embodiment, Formula 4 may be represented by Formula 7 below:

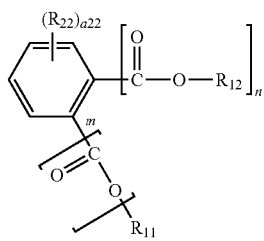

<Formula 7>

In Formula 1, substituents and symbols are the same defined in Formula 4.

In an embodiment, the solvent may be selected from diethylene glycol (mono)phenyl ether, dipropylene glycol (mono)phenyl ether, ethyleneglycol (mono)phenyl ether, propylene glycol (mono)phenyl ether, ethylhexyl benzoate, pentyl benzoate, hexyl benzoate, diisobutyl phthalate, dimethyl phthalate, diethyl phthalate, diisopropyl phthalate, dipropyl phthalate, dibutyl phthalate, diisobutyl phthalate, dipentyl phthalate, diisoamyl phthalate, dihexyl phthalate, diethylhexyl phthalate, ethyl phthalyl ethyl glycolate, triethanolamine, ditridecyl phthalate, benzyl butyl phthalate, nonyl phenol, 1,3-butanediol, oleyl alcohol, N-(2-hydroxyethyl)-2-pyrrolidone, tri-n-butyl citrate, di-(2-ethyl hexyl) sebacate, diethylene glycol, 1,9-nonanediol, dipropylene glycol, thiodiethylene glycol, 1,3-propanediol, 1,4-butanediol, di-(2-ethylhexyl)azelate, N-cyclohexyl-2-pyrrolidone, oleic acid, N-benzyl pyrrolidone, hexane 1,6 diol, 2-ethyl-1,3-hexanediol, triethylene glycol, and any combination thereof.

[Subminiature Light-Emitting Diodes]

The subminiature light-emitting diodes may be a nano LED in a nano unit size, or a micro LED in a micro unit size.

Each of the subminiature light-emitting diodes may include a first semiconductor layer, a second semiconductor layer, and an active layer disposed between the first semiconductor layer and the second semiconductor layer.

The first semiconductor layer, the active layer, and the second semiconductor layer may be sequentially stacked in the longitudinal direction of the subminiature light-emitting diodes.

For example, the first semiconductor layer may include an n-type semiconductor layer, and the second semiconductor layer may include a p-type semiconductor layer. Such semiconductor layers may include a semiconductor material having a composition formula of InxAlyGa1-x-yN (where $0 \leq x \leq 1$, $0 \leq y \leq 1$, and $0 \leq x+y \leq 1$), such as GaN, AlN, AlGaN, InGaN, InN, InAlGaN, AlInN, or the like.

The first semiconductor layer may be doped with an n-type dopant, such as Si, Ge, Sn, and the like, and the second semiconductor layer may be doped with a p-type dopant, such as Mg, Zn, Ca, Sr, Ba, and the like.

For example, the first semiconductor layer may include a p-type semiconductor layer, and the second semiconductor layer may include an n-type semiconductor layer.

The active layer may be disposed between the first semiconductor layer and the second semiconductor layer, and for example, may be formed in a single quantum well structure or a multiple quantum well structure. The active layer is a region where electrons and holes recombine, and as electrons and holes recombine, the active layer transitions to a low energy level, thereby generating light having a wavelength corresponding thereto. When the active layer is included in a typical LED used for lighting, display, or the like, the active layer may be used without limitation. The active layer may be variously positioned according to the type of the light-emitting diode.

The embodiments are not limited to the above-described embodiments, and in an embodiment, the subminiature light-emitting diodes may further include a separate fluorescence layer, a separate active layer, a separate semiconductor layer, and/or a separate electrode layer, on an upper portion or a lower portion of the first semiconductor layer and the second semiconductor layer. Light generated from the active layer may be emitted to the outer surface and/or both side surfaces of the subminiature light-emitting diodes.

In embodiments, each of the subminiature light-emitting diodes may further include a first electrode layer disposed under the first semiconductor layer and a second electrode layer disposed over the second semiconductor layer.

The first electrode layer and the second electrode layer may each serve as an ohmic contact electrode. However, the first electrode layer and the second electrode layer are not limited thereto, and may each serve as a Shottky contact electrode. The first electrode layer and the second electrode layer may include, for example, one or more metals selected from aluminum, titanium, indium, gold, and silver. Materials included in the first electrode layer and the second electrode layer may be identical to or different from each other.

The subminiature light-emitting diodes may further include an insulating film surrounding the outer surface thereof. As the insulating film protects the outer surface of the light-emitting diodes including the outer surface of the active layer, a decrease in luminescence efficiency may be prevented. The insulating film may cover the entire outer surface of the light-emitting diodes, or may cover only a part of the outer surface of the light-emitting diodes.

The subminiature light-emitting diodes may have various shapes, such as a cylinder, a cube, and the like. For example, the subminiature light-emitting diode may have a cylindrical shape.

For example, the subminiature light-emitting diodes may have a diameter in a range of about 0.1 µm to about 1 µm and a length in a range of about 0.1 µm to about 10 µm, but embodiments are not limited thereto.

The subminiature light-emitting diodes may emit red light, green light, or blue light.

In an embodiment, a concentration of the subminiature light-emitting diodes may be in a range of about 0.01 weight % to about 1 weight % based on the total ink composition.

In an embodiment, the ink composition may further include one or more additives (e.g., a dispersant, a thickener, etc.) to improve the dispersion degree of the subminiature light-emitting diode or to set appropriate viscosity at a deformable printer head temperature during the inkjet process.

[Additives]

The dispersant may be used to improve the deagglomeration effect of the subminiature light-emitting diode, and to serve as a protective layer of the subminiature light-emitting diode during a solution process.

A resin-type dispersant may be used in the ink composition, such as a phosphate ester-based dispersant, a urethane-based dispersant, and an acryl-based dispersant. In detail, as a commercial product of the dispersant, the products of BYK-Chemie Company named DISPER BYK-103, DISPER BYK-110, DISPER BYK-111, DISPER BYK-2000, DISPER BYK-2001, DISPER BYK-2011, DISPER BYK-2070, DISPER BYK-2150, DISPER BYK-160, DISPER BYK-161, DISPER BYK-162, DISPER BYK-163, DISPER BYK-164, and DISPER BYK-166 may be used.

An amount of the dispersant may be in a range of about 10 parts by weight to about 50 parts by weight, based on 100 parts by weight of the subminiature light-emitting diode. For example, the amount of the dispersant may be in a range of about 15 parts by weight to about 30 parts by weight, based on 100 parts by weight of the subminiature light-emitting diode. When the amount of the dispersant is satisfied within the ranges above, agglomeration of the subminiature light-emitting diode in the ink composition may be substantially prevented, and the dispersant may be able to serve as a protective layer of the subminiature light-emitting diode.

The ink composition may further include, as necessary, an adhesion promoter for increasing adhesion to the substrate, a leveling agent for improving coating properties, an antioxidant, an ultraviolet absorber, or any combination thereof.

A material to increase adhesion to the substrate may be used as an adhesion promoter in the ink composition. For example, such a material may include a silane coupling agent having a reactive substituent selected from a carboxyl group, a methacryloyl group, an isocyanate group, an epoxy group, and a combination thereof. However, embodiments are not limited thereto. For example, the silane coupling agent may include trimethoxy silylbenzoic acid, γ-methacryloxy propyltrimethoxy silane, vinyltriacetoxy silane, vinyltrimethoxy silane, γ-isocyanate propyltriethoxy silane, γ-glycidoxy propyltrimethoxy silane, β-(3,4-epoxy cyclohexyl) ethyltrimethoxy silane, or any combination thereof.

A leveling agent may be used in the ink composition. Although not particularly limited, a silicon-based compound, a fluorine-based compound, a siloxane-based compound, a non-ionic surfactant, an ionic surfactant, a titanate coupling agent, and the like may be used. For example, as the leveling agent, a silicon-based compound and/or a fluorine-based compound may be used.

A silicon-based compound may be used in the ink composition. Although not particularly limited, dimethyl silicon, methyl silicon, phenyl silicon, methylphenyl silicon, alkyl-denatured silicon, alkoxy-denatured silicon, polyether-denatured silicon, and the like may be used. For example, as the silicon-based compound, dimethyl silicon, methylphenyl silicon, and the like may be used A fluorine-based compound may be used in the ink composition. Although not particularly limited, polytetrafluorethylene, polyvinylidenefluoride, fluoroalkyl methacrylate, perfluoropolyether, perfluoroalkylethylene oxide, and the like may be used. For example, as the fluorine-based compound, polytetrafluorethylene may be used.

A siloxane-based compound may be used in the ink composition. Although not particularly limited, a dimethyl siloxane compound (product name: KF96L-1, KF96L-5, KF96L-10, or KF96L-100, manufactured by Shinetsu Silicon Company) may be used.

The leveling agent may be used alone, or may be used in a combination of two or more materials.

An amount of the leveling agent varies depending on the desired performance, but may be in a range of about 0.001 weight % to about 5 weight %, based on the total weight of the ink composition. For example, the leveling agent may be in a range of about 0.001 weight % to about 1 weight %, based on the total weight of the ink composition. When the amount of the leveling agent is satisfied within the ranged above, the flowability of the ink composition and the uniformity of the film may be improved.

[Preparation, Storage, and Use of Ink Composition]

Methods of preparing, storing, and using the ink composition according to an embodiment are as follows. However, the methods are not limited to the following description, and embodiments may include various methods of appropriately dispersing the subminiature light-emitting diode in a given solvent.

Preparation

Subminiature light-emitting diodes and a solvent are mixed at an appropriate ratio and subjected to dispersion.

The size of the subminiature light-emitting diodes may be in a range of about 0.1 μm to about 10 μm.

A concentration of the subminiature light-emitting diodes may be in a range of about 0.01 weight % to about 1 weight %, and as necessary, a dispersant having an amount in a range of about 10 weight % to about 50 weight % based on the concentration of the subminiature light-emitting diode may be further added.

A dispersion method may include, for example, sonication, stirring, milling, and the like, each performed for 10 minutes or more. As necessary, a temperature of the solvent may be raised to a range of about 40° C. to about 60° C. for dispersion.

Storage

The ink composition thus prepared may be stored at room temperature (for example, 23° C.). In case that the ink composition is used after 12 hours or more since the preparation, the ink composition may need to be re-dispersed through bath sonication for 5 minutes or longer (for example, 5 minutes to 10 minutes) and vortexing (or stirring) for 10 minutes or more (for example, 10 minutes to 15 minutes) before use.

Use

During the inkjet printing process, a temperature of a coater or a printer head is locally set to be in a range of about 40° C. to about 60° C. Considering smooth ejection of the ink composition and obtaining impact accuracy of the ink composition, the temperature set herein may be additionally raised or lowered depending on the type of the solvent.

[Inkjet Printing Process]

The ink composition may be used to prepare a light-emitting apparatus according to an inkjet printing process.

The ink composition may be provided on a substrate by the inkjet printing process, wherein the substrate includes an emission region in which a first electrode and a second electrode are disposed.

The emission region of the substrate consists of unit emission regions (also referred to as pixels) which are the smallest units for displaying information, and each unit emission region consists of a combination of three sub-unit emission regions (also referred to as sub-pixels) which express red, green, and blue (RGB) colors.

Each sub-pixel may have a wall having a suitable height to trap printed microdroplets, and the printed microdroplets may be dried inside the wall of each sub-pixel.

Since the ink composition has excellent inkjet ejection stability, the ink composition may be appropriately used in the inkjet printing process.

The inkjet printing process may use an inkjet printer having an inkjet head equipped with a piezo-type nozzle configured to apply a pressure according to a voltage.

The ink composition may be ejected from the nozzle of the inkjet to the substrate.

An ejection amount of the ink composition may be in a range of about 1 pL/time to about 50 pL/time. For example, the ejection amount of the ink composition may be in a range of about 1 pL/time to about 30 pL/time. For example, the ejection amount of the ink composition may be in a range of about 1 pL/time to about 20 pL/time.

To minimize clogging of the nozzle and improve ejection accuracy, an aperture size of the inkjet head may be in a range of about 5 μm to about 50 μm. For example, the aperture size of the inkjet head may be in a range of about 10 μm to about 30 μm. However, embodiments are not limited thereto.

An ejection pressure of the inkjet heat may be in a range of about $1,000$ $s^{-1}$ to about $10,000$ $s^{-1}$ based on the shear rate. However, embodiments are not limited thereto.

The viscosity of the ink composition ejected from the inkjet head may be in a range of about 5 cP to about 14 cP.

A temperature of the inkjet head may be, for example, in a range of about 35° C. to about 70° C.

Considering the volume of the sub-pixel regions, the microdroplets may be printed repeatedly multiple times.

[Method of Preparing Light-Emitting Apparatus]

The ink composition according to an embodiment may be used to manufacture a light-emitting apparatus.

In an embodiment, a method of preparing the light-emitting apparatus includes: providing a substrate including an emission region in which a first electrode and a second electrode are spaced apart from each other; providing the ink composition according to an embodiment on the emission region to dispose subminiature light-emitting diodes in the emission region; and aligning the subminiature light-emitting diodes between the first electrode and the second electrode to connect the subminiature light-emitting diode between the first electrode and the second electrode.

In an embodiment, the providing of the ink composition on the emission region may be performed by an inkjet printing process. For example, the inkjet head may be positioned on the emission region, and the ink composition may be ejected therefrom, so as to introduce the subminiature light-emitting diode over the first electrode and the second electrode.

The solvent of the ink composition may be vaporized at room temperature or by heat after the providing of the ink composition.

The subminiature light-emitting diodes may be aligned to be physically and/or electrically connected between the first electrode and the second electrode. In an embodiment, power may be applied to power wiring connected to the first electrode and the second electrode, so as to form an electric field between the first electrode and the second electrode. The power may be alternating current power or direct current power, each having a certain amplitude and a certain period.

The subminiature light-emitting diode may be regarded as a semiconductor, and may be aligned between electrodes according to the principle of dielectrophoresis.

When voltage is applied to the first electrode and the second electrode, bipolarity may be induced in the subminiature light-emitting diode due to an uneven electric field formed between the first electrode and the second electrode.

Accordingly, the subminiature light-emitting diode may be self-aligned between the first electrode and the second electrode, so that both ends of the subminiature light-emitting diode may respectively contact the upper surfaces of the first electrode and the second electrode.

A method of aligning the subminiature light-emitting diode between the first electrode and the second electrode is not limited thereto.

As necessary, the aligning of the subminiature light-emitting diode may be performed at a higher temperature than room temperature. For example, the aligning of the subminiature light-emitting diode may be performed at a temperature in a range of about 35° C. to about 70° C.

Definitions of Substituents

In the following definition of substituents, the carbon number range is only exemplary.

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —O$A_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a carbocyclic aromatic system that has at least one heteroatom selected from N, O, Si, P, and S as a ring-forming atom, in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein refers to —O$A_{102}$ (wherein $A_{102}$ is the $C_6$-$C_{60}$ aryl group), and the term "$C_6$-$C_{60}$ arylthio group" as used herein refers to —S$A_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. A detailed example of the monovalent non-aromatic condensed polycyclic group is a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, Si, P, and S, other than carbon atoms, as a ring-forming atom, and no aromaticity in its entire molecular structure. An example of the monovalent non-aromatic condensed heteropolycyclic group is a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

In the specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

*, *', and *''', as used herein, unless defined otherwise, each refer to a binding site to a neighboring atom in a corresponding formula.

Hereinafter, a compound according to embodiments and an organic light-emitting diode according to embodiments will be described in detail with reference to Examples. The wording "B was used instead of A" used in describing Synthesis Examples and Examples refers to that an identical molar equivalent of B was used in place of A.

Hereinafter, the ink composition will be described in more detail through Examples and/or Comparative Examples. However, the following Examples are intended to specifically illustrate or describe the disclosure, and thus do not limit the scope of the disclosure.

EXAMPLES

1. Preparation of Subminiature Light-Emitting Diode

LED elements were grown and separated by a chemical vapor deposition (CVD) method, so as to prepare subminiature light-emitting diodes.

2. Preparation of Solvent

For use as a solvent, diethylene glycol (mono)phenyl ether (DEGPhE) [Example 1];

triethylene glycol (mono)methyl ether (TGME) [Comparative Example 1];

2-ethyl-1,3-hexanediol (EHD) [Comparative Example 2]; and a mixture of EHD and triethyl citrate (at a weight ratio of 5:5) [Example 2]

were prepared.

3. Preparation of Ink Composition

At room temperature, the subminiature light-emitting diodes (0.05 weight %) were mixed with a solvent shown in Table 1, and the mixed solution was subjected to bath-type sonication for 5 minutes and stirring using a magnetic bar for 1 hour, thereby preparing an ink composition.

Regarding the stirring, the stirring was performed at 60° C. for the first 30 minutes and at room temperature (23° C.) for the remaining 30 minutes.

TABLE 1

|  | Solvent (100) | Subminiature light-emitting diode |
|---|---|---|
| Example 1 | DEGPhE | 0.05 weight % |
| Example 2 | EHD:Triethyl citrate (50:50) | 0.05 weight % |
| Comparative Example 1 | TGME | 0.05 weight % |
| Comparative Example 2 | EHD | 0.05 weight % |

4. Temperature-Depending Viscosity Measurement

Figure 2:
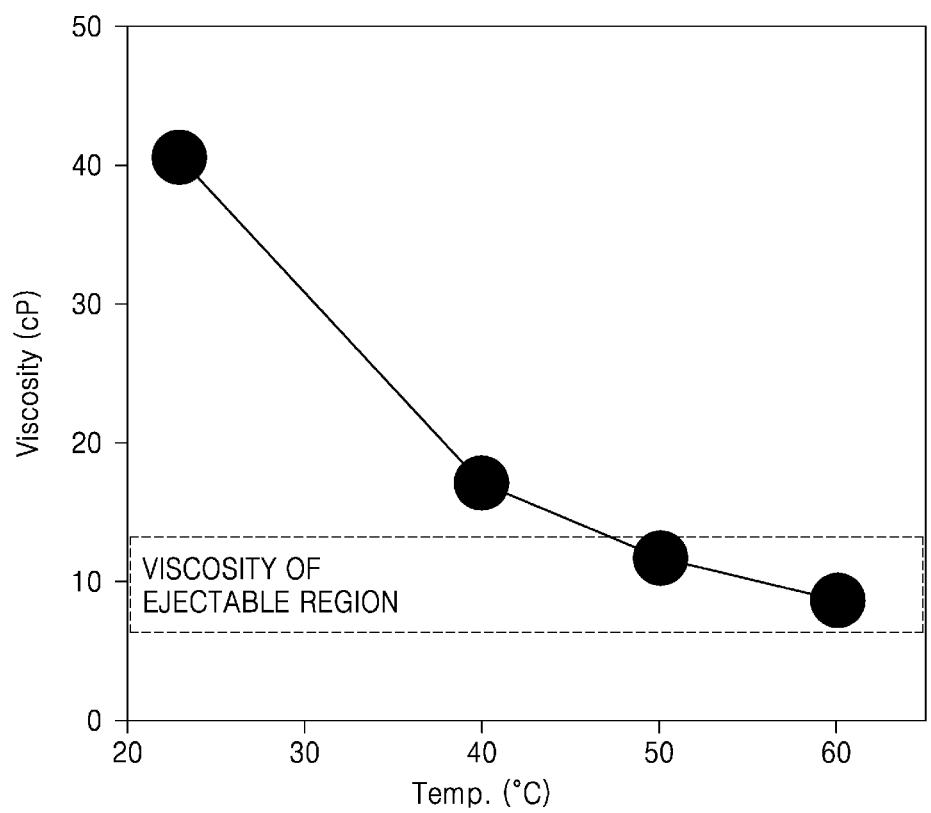
FIG. 2 is a graph showing temperature-dependent viscosity of an ink composition according to an embodiment.

Regarding the ink composition of Example 1, the viscosity was measured for each temperature, and the results are shown in FIG. 2.

Here, the viscosity was measured by using a rotation type viscometer.

Referring to FIG. 2, it was confirmed that the ink composition of Example 1 using DEGPhE as a solvent had high viscosity at a storage temperature section and low viscosity in an ejectable region at a high temperature.

Therefore, the ink composition according to an embodiment was excellent in dispersibility as sedimentation hardly occurred due to high viscosity at the storage temperature section, and was also able to obtain high inkjet printing processability at a high temperature due to low viscosity in the ejectable region at a high temperature.

5. Comparison of Dispersion Stability

Figure 3:
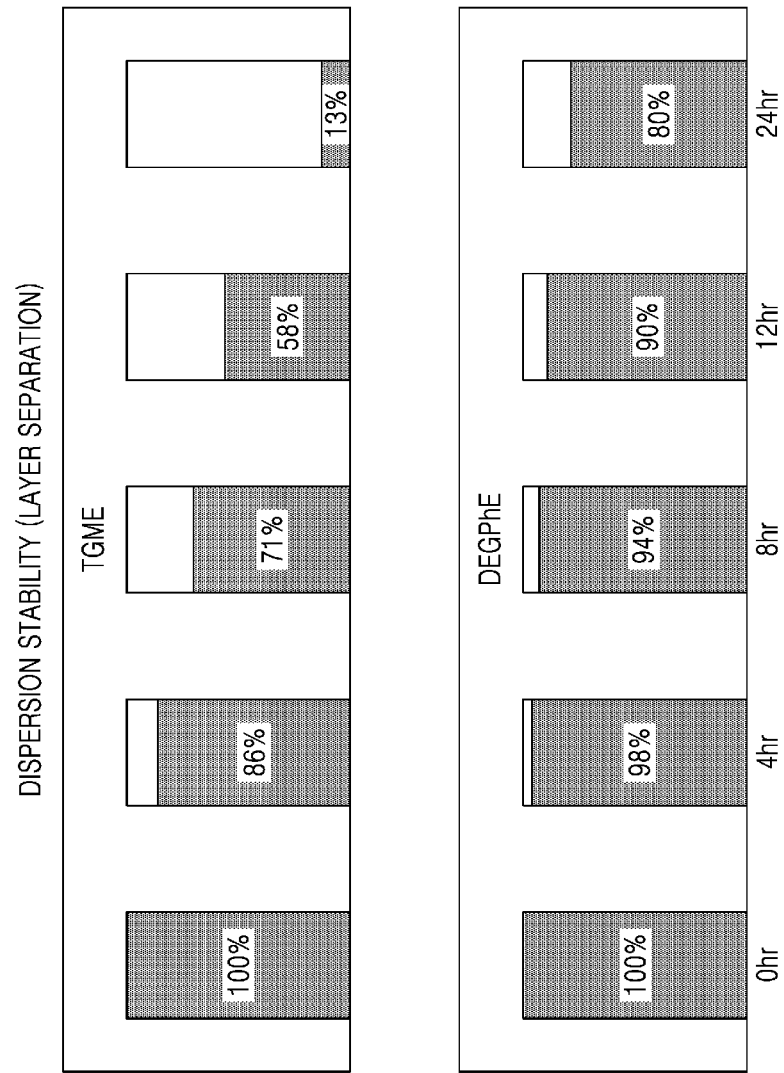
FIG. 3 is a graph showing the degree of layer separation over the elapsed time after dispersion of ink compositions prepared according to Example 1 and Comparative Example 1.

Regarding the ink compositions of Example 1 and Comparative Example 1, the dispersion stability over time was measured, and the results are shown in FIG. 3.

By using a Turbiscan meter (a device for measuring ink dispersion stability through laser scattering), layer separation by particle sedimentation was observed for each elapsed time after dispersion. Here, % value refers to a proportion of the lower portion of the supernatant after sedimentation occurred. Therefore, the higher the % value is, the less the layer separation by particle sedimentation occurs, and the lower the % value is, the severe the particle sedimentation occurs by more particle sedimentation, thereby degrading the dispersion stability.

Referring to FIG. 3, it was confirmed that Example 1 showed excellent results compared to Comparative Example 1.

6. Comparison of Viscosity, Dispersion Stability Time, and Impact Accuracy of Ink Composition Regarding the ink compositions of Examples 1 and 2 and Comparative Examples 1 and 2, the viscosity at 23° C. and 60° C., the dispersion stability time at 23° C., and the impact accuracy were measured, and the results are shown in Table 2.

TABLE 2

|  | Viscosity (cP) | | Dispersion stability time (23° C.) [1] | Impact accuracy [2] |
|---|---|---|---|---|
|  | Room temperature (23° C.) | High temperature (60° C.) | | |
| Example 1 | 38 | 8 | 16 hours | No more than 5% |
| Example 2 | 40 | 9 | 16 hours | No more than 5% |
| Comparative Example 1 | 9 | 3 | No more than 4 hours | No more than 5% |
| Comparative Example 2 | 265 | 23 | No more than 120 hours | No more than 8% |

[1] The dispersion stability time refers to a measurement of the time required until 15% separation occurs at 23° C.
[2] The impact accuracy is calculated by ejecting ink to a test film through a film measurement system and obtaining coordinates of the impact points through a camera.

Referring to Table 2, it was confirmed that for the ink compositions of Examples 1 and 2, the viscosity at room temperature was high so that 16 hours of the dispersion stability time was obtained, and that the viscosity at a high temperature was low so that satisfactory impact accuracy was obtained.

Regarding the ink compositions of Comparative Examples 1 and 2, it was confirmed that the ink composition of Comparative Example 1 had low viscosity at room temperature so that only 4 hours or less of the dispersion stability time was obtained, and that the ink composition of Comparative Example 2 had high viscosity at a high temperature so that non-satisfactory impact accuracy was obtained.

7. Alignment of Subminiature Light-Emitting Diode

After the first electrode and the second electrode were formed on the substrate, the ink composition of Example 1 was ejected to the emission region by using an inkjet printer (having a head temperature of 60° C.), so that the subminiature light-emitting diodes were introduced on the first electrode and the second electrode.

Subsequently, the alternating current power in a range of about 5 V to about 100 V was applied to the power wiring connected to the first electrode and the second electrode, thereby forming an electric field for about 1 minute to about 30 minutes.

The solvent was evaporated by vacuuming ($1 \times 10^{-5}$ Pa to 1 Pa) at temperatures between room temperature and 250° C. for about 1 minute to about 30 minutes.

Afterwards, it was confirmed that the light-emitting diode was well operated.

According to embodiments, an ink composition has high viscosity at room temperature so that layer separation hardly occurs even when stored for a long time, and also has low viscosity at a high temperature so that an inkjet printing process is performed without difficulty.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An ink composition for an inkjet printer comprising:
   light-emitting diodes; and
   a solvent,
   wherein the solvent has a first viscosity at a first temperature section that is greater than a second viscosity at a second temperature section, and
   each of the light-emitting diodes have a size in a range of about 0.1 μm to about 10 μm.

2. The ink composition of claim 1, wherein the first temperature section includes a temperature at which the ink composition is stored.

3. The ink composition of claim 1, wherein
   the inkjet printer comprises an ejection portion, and
   the second temperature section includes a temperature of the ejection portion.

4. The ink composition of claim 1, wherein the first viscosity is in a range of about 15 cP to about 100 cP.

5. The ink composition of claim 1, wherein the second viscosity is in a range of about 5 cP to about 14 cP.

6. The ink composition of claim 1, wherein the solvent comprises an ester compound of citric acid, glycol, alkanediol, alkanolamine, alkenic acid, alkenol, a pyrrolidone group-containing compound, glycerol, a compound represented by Formula 1, a compound represented by Formula 2, or any combination thereof:

$$Ar_1\text{—}[OR_1]_l\text{—}OH \quad \text{<Formula 1>}$$

$$R_{11}\text{—}[O\text{—}\overset{O}{\underset{\|}{C}}]_m\text{—}Ar_2\text{—}[\overset{O}{\underset{\|}{C}}\text{—}O\text{—}R_{12}]_n \quad \text{<Formula 2>}$$

wherein in Formulae 1 and 2,
$Ar_1$ is a substituted or unsubstituted $C_6$-$C_{60}$ aryl group,
$Ar_2$ is selected from a substituted or unsubstituted $C_6$-$C_{60}$ arylene group and a substituted or unsubstituted $C_1$-$C_{20}$ alkylene group,
$R_1$ is selected from a substituted or unsubstituted $C_1$-$C_{20}$ alkylene group and a substituted or unsubstituted $C_2$-$C_{20}$ alkenylene group,
$R_{11}$ and $R_{12}$ are each independently selected from a substituted or unsubstituted $C_1$-$C_{20}$ alkyl group, a substituted or unsubstituted $C_2$-$C_{20}$ alkenyl group, and a substituted or unsubstituted $C_6$-$C_{60}$ aryl group,
l is an integer from 1 to 5,
n is 0 or 1, and
m is an integer from 1 to 3.

7. The ink composition of claim 6, wherein Formula 1 is represented by Formula 3:

$$(R_{21})_{a21}\text{—}\underset{}{\bigcirc}\text{—}[OR_1]_l\text{—}OH \quad \text{<Formula 3>}$$

wherein in Formula 3,
$R_{21}$ is selected from hydrogen, deuterium, a hydroxyl group, and a substituted or unsubstituted $C_1$-$C_{20}$ alkyl group,
a21 is an integer from 1 to 5, and
$R_1$ and l are the same as defined in Formula 1.

8. The ink composition of claim 6, wherein Formula 2 is represented by Formula 4:

$$(R_{22})_{a22}\text{—}\underset{}{\bigcirc}\begin{matrix}\text{—}[\overset{O}{\underset{\|}{C}}\text{—}O\text{—}R_{12}]_n \\ \text{—}[\overset{O}{\underset{\|}{C}}\text{—}O]_m\text{—}R_{11}\end{matrix} \quad \text{<Formula 4>}$$

wherein in Formula 4,
$R_{22}$ is selected from hydrogen, deuterium, a hydroxyl group, and a substituted or unsubstituted $C_1$-$C_{20}$ alkyl group,
a22 is an integer from 1 to 4, and
$R_{11}$, $R_{12}$, m, and n are the same as defined in Formula 2.

9. The ink composition of claim 1, wherein the solvent is selected from diethylene glycol (mono)phenyl ether, dipropylene glycol (mono)phenyl ether, ethyleneglycol (mono) phenyl ether, propylene glycol (mono)phenyl ether, ethylhexyl benzoate, pentyl benzoate, hexyl benzoate, diisobutyl phthalate, dimethyl phthalate, diethyl phthalate, diisopropyl phthalate, dipropyl phthalate, dibutyl phthalate, diisobutyl phthalate, dipentyl phthalate, diisoamyl phthalate, dihexyl phthalate, diethylhexyl phthalate, ethyl phthalyl ethyl glycolate, triethanolamine, ditridecyl phthalate, benzyl butyl phthalate, nonyl phenol, 1,3-butanediol, oleyl alcohol, N-(2-hydroxyethyl)-2-pyrrolidone, tri-n-butyl citrate, di-(2-ethyl hexyl) sebacate, diethylene glycol, 1,9-nonanediol, dipropylene glycol, thiodiethylene glycol, 1,3-propanediol, 1,4-butanediol, di-(2-ethylhexyl)azelate, N-cyclohexyl-2-pyrrolidone, oleic acid, N-benzyl pyrrolidone, hexane 1,6 diol, 2-ethyl-1,3-hexanediol, triethylene glycol, and any combination thereof.

10. The ink composition of claim 1, wherein each of the light-emitting diodes comprises:
    a first semiconductor layer;
    a second semiconductor layer; and
    an active layer disposed between the first semiconductor layer and the second semiconductor layer.

11. The ink composition of claim 10, wherein each of the light-emitting diodes further comprises:
    a first electrode layer disposed under the first semiconductor layer; and
    a second electrode layer disposed over the second semiconductor layer.

12. The ink composition of claim 1, wherein the light-emitting diode have a cylinder shape.

13. The ink composition of claim 1, wherein the light-emitting diodes have:
    a diameter in a range of about 0.1 μm to about 1 μm, and
    a length in a range of about 0.1 μm to about 10 μm.

14. The ink composition of claim 1, wherein the light-emitting diodes have a concentration in a range of about 0.01 weight % to about 1 weight % based on the total ink composition.

15. A method of manufacturing a light-emitting apparatus comprising:
    providing a substrate including an emission region in which a first electrode and a second electrode are spaced apart from each other;
    providing the ink composition of claim 1 on the emission region to dispose the light-emitting diodes in the emission region; and aligning the light-emitting diodes at a region between the first electrode and the second electrode.

16. The method of claim 15, wherein the providing of the ink composition on the emission region is performed by an inkjet printer.

17. The method of claim 16, wherein:
the inkjet printer comprises an ejection portion, and
the viscosity of the ink composition in the ejection portion is in a range of about 5 cP to about 14 cP.

18. The method of claim 16, wherein:
the inkjet printer comprises an ejection portion, and
the ejection portion has a temperature in a range of about 35° C. to about 70° C.

19. The method of claim 15, wherein the aligning of the light-emitting diodes includes applying an electric field formed between the first electrode and the second electrode.

20. A light-emitting device comprising:
a first electrode;
a second electrode facing the first electrode; and
a layer disposed between the first electrode and the second electrode, wherein
the layer includes an emission layer, and
the layer is formed by using the ink composition of claim 1.

* * * * *